United States Patent [19]

Schwalm et al.

[11] Patent Number: 5,073,474

[45] Date of Patent: * Dec. 17, 1991

[54] RADIATION-SENSITIVE MIXTURE CONTAINING ACID LABILE GROUPS AND PRODUCTION OF RELIEF PATTERNS

[75] Inventors: Reinhold Schwalm, Wachenheim; Horst Binder, Lampertheim; Andreas Boettcher, Nussloch, all of Fed. Rep. of Germany

[73] Assignee: BASF Aktiengesellschaft, Ludwigshafen, Fed. Rep. of Germany

[*] Notice: The portion of the term of this patent subsequent to Nov. 28, 2006 has been disclaimed.

[21] Appl. No.: 352,415

[22] Filed: May 16, 1989

[30] Foreign Application Priority Data

May 19, 1988 [DE] Fed. Rep. of Germany ....... 3817009

[51] Int. Cl.$^5$ .................. G03F 7/039; G03F 7/075; G03F 7/30; G03F 7/40
[52] U.S. Cl. ............................ 430/270; 430/176; 430/192; 430/921; 430/914; 430/910; 430/905; 430/330; 430/296; 430/325; 430/967; 522/31; 522/32
[58] Field of Search ............... 430/176, 192, 921, 914, 430/910, 905, 330, 270, 296, 325, 967; 522/31, 32

[56] References Cited

U.S. PATENT DOCUMENTS

| | | | |
|---|---|---|---|
| 3,779,778 | 12/1973 | Smith et al. | 430/270 |
| 3,915,706 | 10/1975 | Limburg et al. | 430/270 |
| 4,491,628 | 1/1985 | Ito et al. | 430/176 |
| 4,678,737 | 7/1987 | Schneller et al. | 430/270 |
| 4,689,288 | 8/1987 | Buiguez et al. | 430/270 |
| 4,770,977 | 9/1988 | Buiguez et al. | 430/323 |
| 4,820,607 | 4/1989 | Aoai | 430/270 X |
| 4,883,740 | 11/1989 | Schwalm et al. | 430/270 |

FOREIGN PATENT DOCUMENTS

| | | |
|---|---|---|
| 0146411 | 6/1986 | European Pat. Off. |
| 0249139 | 12/1987 | European Pat. Off. |
| 3628046 | 2/1987 | Fed. Rep. of Germany |

OTHER PUBLICATIONS

Crivello, "Org. Coatings and Appl. Polym. Sci.", 48, pp. 65-69 (1985).
Ito, "J. Polym. Sci., Part A, Polym-Chem. Ed.", vol. 24, 2971-2980 (1986).
Pampalone, "Solid State Technology", (Novolak Resins Used in Positive Resist Systems) Jun. 1984, pp. 115-120.
S. Peter Papos, *Journal of Imaging Technology*, vol. 11, No. 4, Aug. 1985, pp. 146-157.

*Primary Examiner*—Cynthia Hamilton
*Attorney, Agent, or Firm*—Keil & Weinkauf

[57] ABSTRACT

A radiation sensitive mixture suitable for producing relief patterns contains
 (a) a polymeric binder which is insoluble in water but soluble in aqueous alkaline solutions and
 (b) an organic compound whose solubility in an aqueous alkaline developer is increased by the action of acid and which contains at least one acid cleavable group and additionally a group which forms a strong acid on irradiation, wherein the polymeric binder (a) contains from 5 to 35 mol % of monomer units having acid labile groups as copolymerized or cocondensed units or acid labile groups introduced by polymer analaogous reaction.

10 Claims, No Drawings

RADIATION-SENSITIVE MIXTURE CONTAINING ACID LABILE GROUPS AND PRODUCTION OF RELIEF PATTERNS

The present invention relates to positive working radiation sensitive mixtures which contain a polymeric binder which is soluble in aqueous alkali and contains hydrophobic comonomer units with acid labile groups, and a compound which contains at least one acid cleavable bond and on irradiation forms a strong acid, the solubility of the compound in an alkaline solvent being increased by the action of the acid. These mixtures are sensitive to UV rays, electron beams and X-rays and are suitable in particular for use as resist materials.

Positive working radiation sensitive mixtures are known. Commercially, use is made in particular of positive working resist materials which contain o-quinonediazides in binders which are soluble in aqueous alkali, for example novolaks or poly(p-vinylphenol)s. However, the sensitivity of these systems to radiation, in particular shortwave radiation, is not always satisfactory.

Sensitivity increases in radiation sensitive systems which in the primary photoreaction produce a species which then, independently of the radiation, initiates a catalytic secondary reaction are likewise known. US-A-3,915,706 relates for example to photoinitiators which produce a strong acid which in a secondary reaction then cleaves acid labile groups, such as polyaldehyde groups.

The prior art (DE-A-3,406,927) also discloses radiation sensitive mixtures based on acid cleavable compounds which contain as the binder a polymer which is soluble in aqueous alkali, a compound which photochemically forms a strong acid, and a further compound containing acid cleavable bonds, which by the action of the acid become more soluble in an alkaline developer. Compounds mentioned as photochemically forming a strong acid are diazonium, phosphonium, sulfonium and iodonium compounds and also halogen compounds. The use of these onium salts as photochemical acid donors in resist materials is also known for example from US-A-4,491,628. A review of the use of onium salts in resist materials is given by Crivello in Org. Coatings and Appl. Polym. Sci. 48 (1985), 65-69. The disadvantage of these photoinitiators is that, aside from the acids formed, irradiation does not give rise to any photoproducts which increase the solubility in the alkaline developer. Furthermore, these mixtures of necessity require three components.

Radiation sensitive mixtures of polymers having acid labile side groups and photochemical acid donors are known for example from US-A-4,491,628 and FR-A-2,570,844. However, these polymeric binders are hydrophobic and only become alkali soluble on irradiation. Another disadvantage is that the change from hydrophobic to alkali soluble is accompanied by a large loss of substance.

Copolymers having phenolic and acid labile groups, for example poly(p-hydroxystyrene-co-t-butoxycarbonyloxystyrene), are known from J. Polym. Sci., Part A, Polym. Chem. Ed. 24 (1986), 2971-80. However, if those copolymers of this group which are still alkali soluble are used in conjunction with commercial sulfonium salts, such as triphenylsulfonium hexafluoroarsenate, as also described in US-A-4,491,628, these mixtures have the disadvantage of very high depletion in the unexposed areas, since the sulfonium salts mentioned are not sufficiently strong solubility inhibitors. Nor, after irradiation, do these salts contribute much to increasing the solubility of the irradiated areas in alkaline developers, since, besides the acids formed, no alkali soluble photoproducts are formed.

DE-A-3,721,741 proposes radiation sensitive mixtures which contain a polymeric binder which is soluble in aqueous alkaline solutions and an organic compound whose solubility in an aqueous alkaline developer is increased by the action of acid, which contains at least one acid cleavable group and which on irradiation produces a strong acid. However, these systems have disadvantages for certain applications. For instance, in these systems the organic compound has two functions, namely to reduce the solubility of the polymeric binder prior to irradiation and to raise it after irradiation and, secondly, the compound must be radiation sensitive. However, for certain applications it is advantageous to reduce the proportion of photoactive organic compound, for example in order to obtain a higher transparency in the shortwave UV field (in the region of 250 nm), so that solubility inhibition must be achieved in some other way.

EP-A-0,249,139 describes resist compositions which contain an organic polymer which is soluble in water or in aqueous bases, a compound which contains an acid labile group and which is a solubility inhibitor for the water-soluble polymer, for example a tert-butyl ester compound, and an arylonium salt, for example an arylsulfonium or aryliodonium salt. The organic polymer described therein is a novolak having an average molecular weight of from 200 to 20,000. The disadvantage of these resist compositions is their low transparency in the wavelength region below 300 nm and the low thermal stability due to the use of the relatively low molecular weight novolaks. EP-A-0,146,411 describes photosolubilizable mixtures which consist of an alkali soluble phenolic resin, specifically a novolak or resol resin, and a radiation sensitive onium salt. The disadvantages of these mixtures are their low light-sensitivity, their low transparency in the wavelength region below 300 nm and their small processing latitude. For example, it is not possible to bake them after irradiation, which is customarily done in the art to reduce the effects of the standing waves, since the mixtures then tend to undergo crosslinking.

It is an object of the present invention to provide highly reactive radiation sensitive systems for the production of relief structures which are developable with aqueous alkaline solutions and make possible the production of light sensitive layers of high transparency to shortwave UV.

We have found, surprisingly, that this object is achieved in a highly advantageous manner by the mixtures according to the invention.

The present invention accordingly provides a radiation sensitive mixture containing
(a) a polymeric binder which is insoluble in water but soluble in aqueous alkaline solutions and
(b) an organic compound whose solubility in an aqueous alkaline developer is increased by the action of acid and which contains at least one acid cleavable group and additionally a group which forms a strong acid on irradiation,
wherein the polymeric binder (a) contains from 5 to 35 mol % of monomer units having acid labile groups as copolymerized or cocondensed units or the acid labile groups introduced by polymer analogous reaction, preferred acid labile groups being tert-butyl ester, t-butyl carbonate and/or silyl ether groups.

Suitable polymeric binders a) are not only phenolic resins, such as novolaks, poly(p-hydroxystyrenes), poly(p-hydroxy-α-methylstyrenes) or copolymers of p-hydroxystyrene or p-hydroxy-α-methylstyrene that contain the abovementioned acid labile groups, but also copolymers having carboxyl groups, such as methyl methacrylate/methacrylic acid/t-butyl methacrylate copolymers.

Preferred organic compounds (b) are those which contain at least one sulfonium salt group and at least one t-butyl carbonate group or at least one silyl ether group. However, it is also possible to use other compounds which form a strong acid on irradiation and contain an acid cleavable bond in the same molecule.

Preferred organic compounds (b) of this type are those of the general formula (I)

 (I)

where $R^1$, $R^2$ and $R^3$ are identical to or different from one another and each is singly acyclyl or aryl which may contain heteroatoms, or two of $R^1$ to $R^3$ together form a ring, with the proviso that at least one of $R^1$ to $R^3$ contains one or more acid cleavable groups, one of $R^1$ to $R^3$ can be linked to one or more further sulfonium salt residues directly or via acid cleavable groups, and $X^\ominus$ is a nonnucleophilic counterion, for example a dimethyl-4-t-butoxycarbonyloxyphenylsulfonium salt, a phenylbis(4-t-butoxycarbonyloxyphenyl)sulfonium salt, a tris(4-t-butoxycarbonyloxyphenyl)sulfonium salt or a 1-naphthyl-4-trimethylsilyloxytetramethylenesulfonium salt with hexafluoroarsenate, hexafluoroantimonate, hexafluorophosphate and/or tetrafluoroborate as counterion.

Particularly preferred organic compounds (b) of this type are those of the general formula (II)

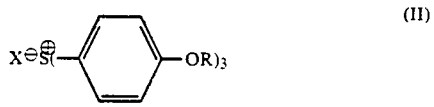 (II)

where R can be H, t-butoxycarbonyl and/or trialkylsilyl, with the proviso that at least one of the radicals R is ≠ hydrogen.

The present invention also provides a process for producing relief patterns and relief images using the radiation sensitive mixture according to the invention, wherein, preferably, irradiation is followed by heating to from 60° to 120° C.

There now follow specifics concerning the buildup components of the radiation sensitive mixture according to the invention.

Polymeric binder (a)

Suitable novolaks are those described for example in Novolak Resins Used in Positive Resist Systems by T. Pampalone in Solid State Technology June 1984, 115-120. For specific applications, for example exposure in shortwave UV, preferred novolaks are made from p-cresol and formaldehyde. To prepare the component (a) to be used according to the invention, these novolaks can then be reacted with di-t-butyl dicarbonate in the presence of potassium t-butylate in, for example, tetrahydrofuran in such a way that up to 30 mol % of the phenolic groups are converted.

Further alkali soluble polymers suitable for use as bases for (a) can be prepared in a conventional manner by a free radical or ionic homopolymerization or copolymerization of one or more ethylenically unsaturated monomers. Ethylenically unsaturated components which can be homopolymerized or copolymerized are for example substituted and unsubstituted styrenes, such as p-hydroxystyrene, p-t-butoxycarbonyloxystyrene, p-vinylbenzoic acid, t-butyl p-vinylbenzoate, p-hydroxy-α-methylstyrene, $C_1$-$C_6$-alkyl acrylates and $C_1$-$C_6$-alkyl methacrylates, such as t-butyl acrylates and/or methacrylates, acrylic acid and methacrylic acid.

Preference is given to copolymers of p-hydroxystyrene which contain from 5 to 35, preferably from 10 to 30%, of monomers having acid labile groups as copolymerized units.

Derivatives of poly(p-hydroxystyrene) can likewise be prepared by the method described by H. Ito in J. Polym. Sci., Part A, Polym. Chem. Ed. 24 (1986), 2971-80, from poly(p-t-butoxycarbonyloxystyrene), which is converted into poly(p-hydroxystyrene) and then reacted with appropriate amounts of di-t-butyl dicarbonate. However, poly(p-hydroxystyrenes) can also be partially converted into silyl ethers, for example with hexamethyldisilazane.

Preferred polymeric binders (a) are in particular those which contain t-butyl carbonate groups, for example copolymers of p-hydroxystyrene and from 10 to 30 mol % of p-t-butoxycarbonyloxystyrene.

The copolymers can be synthesized by free radical polymerization of the corresponding monomers, for example p-hydroxystyrene and p-t-butoxycarbonyloxystyrene, hydroxystyrene and trimethylsilyloxystyrene or p-hydroxystyrene and t-butyl methacrylate, according to known methods of polymer chemistry or by polymer analogous reaction of poly(p-hydroxystyrene) with appropriate compounds to introduce the acid labile groups in appropriate amounts.

The copolymers of p-hydroxystyrene and p-t-butoxycarbonyloxystyrene are described for example in J. Polym. Sci., Part A, Poly. Chem. Ed. 24 (1986), 2971-80. They are prepared from poly(p-hydroxystyrene) by reaction with the appropriate amount of di-t-butyl dicarbonate.

Copolymers of p-hydroxystyrene with trimethylsilyloxystyrene are preparable for example by reacting poly(p-hydroxystyrene) with an appropriate stoichiometric amount of hexamethyldisilazane by heating up to 100° C. in the presence or absence of an inert solvent, such as ethyl acetate or pentanone.

The composition of the copolymers was determined by thermogravimetric analysis and H-NMR spectroscopy.

The invention is not restricted to the copolymers mentioned here, but on the contrary can be applied to a number of alkali soluble copolymers of p-hydroxystyrene, but preferably to those where a further comonomer unit is a p-hydroxystyrene derivative which contains, bonded via the phenolic OH group, such acid labile groups as, under the action of acid, re-form the phenolic OH group.

Preferred polymeric binders (a) are alkali soluble binders having a high proportion of aromatic groups, such as novolaks or poly(p-hydroxystyrene). The absorption of novolaks at a wavelength of 254 nm is for example:

| Novolaks based on o-cresol | optical density | 0.48/μm |
|---|---|---|
| m-cresol | | 0.46/μm |
| p-cresol | | 0.28 μm |

To the absorption of polymeric binder (a) it is necessary to add the absorption of organic compounds (b). For instance, compounds such as phenylbis(t-butoxycarbonyloxyphenyl)sulfonium hexafluoroarsenate and tris(t-butoxycarbonyloxyphenyl)sulfonium hexafluoroarsenate have extinction coefficients in this wavelength region of around 250 nm of greater than 5000 1/mol.cm.

To obtain any solubility inhibition with these components, however, it is necessary to add distinctly more than 10% by weight of these compounds to the binder, if unconverted novolaks or poly(p-hydroxystyrenes) are used, so that optical densities of the order of 1 per μm of layer thickness or higher are the result.

According to the invention, the proportion of compounds (b) can be reduced by using alkali soluble binders containing up to 30 mol % of hydrophobic monomers having acid labile groups. The action of radiation turns compound (b) into a strong acid which increases not only the solubility of compound (b) in alkaline developers but also the solubility of the polymeric binder, through elimination of the acid labile groups. In the exposed areas, the action of radiation thus leads to the formation of alkali soluble products from the photosensitive compounds (b), and the solubility of the polymer is increased at the same time, so that irradiation has the effect of bringing about solubility differentiation.

Comparing two resist compositions which do not show any depletion in the unexposed areas, the use of these specific alkali soluble binders can significantly improve the optical density in the wavelength region around 250 nm:

Poly(p-hydroxystyrene)+20% by weight of tris(t-butoxycarbonyloxyphenyl)sulfonium hexafluoroarsenate: OD (248 nm) 0.95/ μm Poly(p-hydroxystyrene-co-t-butoxycarbonyloxystyrene) +10% by weight of tris(t-butoxycarbonyloxyphenyl)sulfonium hexafluoroarsenate: OD (248 nm) 0.54/ μm High optical densities have an adverse effect on the side wall profile.

Possible methods for the synthesis of the organic compounds (b) are given in DE-A-3,721,741 and DE-A-3,721,740.

The radiation sensitive mixtures according to the invention are sensitive to X-rays, electron beams and UV radiation. If desired, sensitizers may be added in small amounts, for example pyrene and perylene, in order to sensitize the compounds in from the longer wave UV to the visible wavelength region. Irradiation in specific wavelength regions, for example in the shortwave UV region (<300 nm), requires a high transparency of the layers at the particular irradiation wavelength. Conventional exposure units based on mercury lamps make use of the 254 nm line, and excimer lasers emit at 248 nm (KrF). Radiation sensitive recording materials should therefore have very low optical densities in this region.

In the novel process for producing relief patterns, a radiation sensitive recording layer consisting essentially of the novel radiation sensitive mixture is subjected to imagewise exposure at such a rate that the solubility of the exposed areas following a thermal bake at from 60° C. to 120° C. in aqueous alkaline solvents increases and these exposed areas can be selectively removed with the alkaline developer.

It is preferable to dissolve for example the polymeric binder (a), which contains from 5 to 30 mol % of monomer component with acid labile groups and from 2 to 15% by weight, particularly preferably from 5 to 10% by weight, of a compound of type (b) based on the total weight of compounds (a) and (b), in methylglycol acetate or methyl propylene glycol acetate, the solids content advantageously ranging from 10 to 30% by weight. The solution can be filtered through a filter having a pore diameter of 0.2 μm. The resulting resist solution is spincoated at from 1000 to 10000 rpm onto the wafer to produce a resist film. The wafer is then advantageously baked at 90° C. or 80° C. for from 1 to 5 minutes. The films are in general irradiated with UV light from a mercury lamp, with excimer laser light, with electron beams or with X-rays through a chromium coated structured quartz mask. The irradiated films are baked at from 60° to 120° C. for from 5 seconds to 2 minutes. The films thus treated are then developed with alkaline developers with or without an alcohol content, and the exposed areas dissolve away selectively, whereas there is little depletion in the unexposed areas.

In the Examples and Comparative Examples, parts and percentages are by weight, unless otherwise stated.

EXAMPLE 1

A photoresist solution is prepared from 10 parts of tris(4-t-butoxycarbonyloxyphenyl)sulfoniumhexafluoroarsenate, 90 parts of a copolymer of 70 mol % of p-hydroxystyrene and 30 mol % of tert-butoxycarbonyloxystyrene ($\overline{M}_n$ (GPC) about 25000) and 400 parts of methyl propylene glycol acetate. The solution is then filtered through a filter having a pore diameter of 0.2 μm and spincoated in a layer thickness of about 1.0 μm onto a silicon wafer bearing an SiO$_2$ film. The wafer is dried at 90° C. for one minute and then brought into contact with an image structured test mask and irradiated for 3 seconds with excimer laser light of the wavelength 248 nm. It is then heated at 80° C. for 60 seconds and developed with a pH 13.00 developer for 30 seconds. The exposed areas have been completely removed, while no depletion is measured in the unexposed areas. The resist patterns show vertical side walls.

COMPARATIVE EXAMPLE 1

A photoresist solution is prepared from 10 parts of tris(4-t-butoxycarbonyloxyphenyl)sulfoniumhexafluoroarsenate, 90 parts of poly(p-hydroxystyrene) and 400 parts of methyl propylene glycol acetate. Example 1 is repeated. Again the exposed areas are completely removable during the 30 seconds' development time, while, however, the unexposed areas undesirably suffer appreciable depletion (52%).

To reduce the depletion in the unexposed areas, the proportion of sulfonium salts can be increased. For this reason, a photoresist solution was prepared from 20 parts of tris(4-t-butoxycarbonyloxyphenyl)sulfonium hexafluoroarsenate, 80 parts of poly(p-hydroxystyrene)

and 300 parts of methyl propylene glycol acetate. Example 1 is repeated, except that 11 seconds' irradiation is necessary to ensure the complete removal of the exposed areas by the same conditions. The resist profiles have undesirable inclined edges.

COMPARATIVE EXAMPLE 2

This Comparative Example shows that the use of commercial sulfonium salts (without acid labile groups) likewise does not meet the desired reduction in dark depletion to values smaller than 5%.

A photoresist solution is prepared from 10 parts of triphenylsulfonium hexafluoroarsenate, 90 parts of the copolymer of 70 mol % of p-hydroxystyrene and 30 mol % of tert-butylcarbonyloxystyrene mentioned in Example 1 and 400 parts of methyl propylene glycol acetate. The solution is then filtered through a filter having a pore diameter of 0.2 μm and spincoated in a layer thickness of 1.15 μm onto a silicon wafer bearing an SiO₂ film. The wafer is dried at 90° C. for one minute and then treated with a pH 13.0 developer for 30 seconds. Appreciable depletion takes place in the unexposed areas (35%).

EXAMPLE 2

A photoresist solution is prepared from 15 parts of bis(4-t-butoxycarbonyloxyphenyl)-4-hydroxyphenyl-sulfonium hexafluoroarsenate, 85 parts of a copolymer of 82 mol % of p-hydroxystyrene and 18 mol % of 4-t-butoxycarbonyloxystyrene ($\overline{M}_n$ about 22000) and 400 parts of methyl propylene glycol acetate and filtered through a filter having a pore size of 0.2 μm. The photoresist solution is spincoated at 5060 rpm onto an oxidized silicon wafer. After heating at 80° C. for 5 minutes the layer thickness is 1.03 μm. The wafer is then irradiated for 5 seconds through a test mask with excimer laser light of wavelength 248 nm and heated at 90° C. for 1 minute. On development for 30 seconds with an aqueous developer containing 32% of triethanolamine and 10% of isopropanol, the exposed areas are completely removed while the depletion in the unexposed areas is 3.6%.

EXAMPLE 3

A photoresist solution is prepared from 7.5 parts of tris(4-t-butoxycarbonyloxyphenyl)sulfoniumhexafluoroarsenate and 92.5 parts of a copolymer of 70 mol % of p-hydroxystyrene and 30 mol % of 4-t-butoxycarbonyloxystyrene ($\overline{M}_n$ about 25000 g/mol from GPC analysis) and 400 parts of methyl propylene glycol acetate and filtered through a filter having a pore size of 0.2 μm. The photoresist solution is spincoated onto an oxidized silicon wafer in such a way that baking at 80° C. for 5 minutes leaves a layer thickness of 1 μm. The wafer is then irradiated through a test mask with excimer laser light of wavelength 248 nm for 5 seconds and heated at 90° C. for 1 minute. On development with an aqueous developer containing 32% of triethanolamine and 10% of isopropanol for 30 seconds, the exposed areas are completely removed, while the depletion in the unexposed areas is 1%.

We claim:

1. A radiation sensitive mixture containing
   (a) a polymeric binder which is insoluble in water but soluble in aqueous alkaline solutions and
   (b) an organic compound whose solubility in an aqueous alkaline developer is increased by the action of acid and which contains at least one acid cleavable group and additionally a group which forms a strong acid on irradiation, wherein the polymeric binder (a) contains from 5 to 35 mol % of monomer units having acid labile groups as copolymerized or cocondensed units or the acid labile groups introduced by polymer modification reaction.

2. A radiation sensitive mixture as defined in claim 1, wherein the acid labile groups of polymeric binder (a) are tert-butyl ester, t-butyl carbonate and/or silyl ether groups.

3. A radiation sensitive mixture as defined in claim 1, wherein polymeric binder (a) is a phenolic resin.

4. A radiation sensitive mixture as defined in claim 3, wherein the phenolic resin is a novolak.

5. A radiation sensitive mixture as defined in claim 3, wherein the phenolic resin is a copolymer of p-hydroxystyrene or p-hydroxy-α-methylstyrene with a monomer that carries acid labile groups.

6. A radiation sensitive mixture as defined in claim 1, wherein polymeric binder (a) is a methyl methacrylate/methacrylic acid/tert-butyl methacrylate copolymer.

7. A radiation sensitive mixture as defined in claim 1, containing as organic compound (b) at least one compound of the general formula (I)

where R¹, R² and R³ are identical to or different from one another and each is singly acyclyl or aryl which may contain heteroatoms, or two of R¹ to R³ together form a ring, with the proviso that at least one of R¹ to R³ contains one or more acid cleavable groups, one of R¹ to R³ can be linked to one or more further sulfonium salt residues directly or via acid cleavable groups, and X⊖ is a nonnucleophilic counterion.

8. A radiation sensitive mixture as defined in claim 1, wherein organic compound (b) is a dimethyl-4-t-butoxycarbonyloxyphenylsulfonium salt, a phenylbis(4-t-butoxycarbonyloxyphenyl)sulfonium salt, a tris(4-t-butoxycarbonyloxyphenyl)sulfonium salt or a (1-(4-trimethylsilyloxy-)naphthyl-)thiolanium salt with hexafluoroarsenate, hexafluoroantimonate, hexafluorophosphate or tetrafluoroborate as counterion.

9. A process for producing relief patterns and relief images, which comprises spincoating a solution of a radiation sensitive mixture as defined in claim 1 onto a wafer to form a resist film, baking the coating wafer to dry the wafer, irradiating the film imagewise with X-rays, electron beams or UV radiation, heating the irradiated film to a temperature 10. The process of claim 9, wherein the wafer is dried by baking at from 80° to 90° C. for from 1 to 5 minutes.

* * * * *

UNITED STATES PATENT AND TRADEMARK OFFICE
CERTIFICATE OF CORRECTION

PATENT NO. : 5,073,474

DATED : December 17, 1991

INVENTOR(S) : Reinhold SCHWALM et al

It is certified that error appears in the above-identified patent and that said Letters Patent is hereby corrected as shown below:

Claim 9, Column 8, Line 60

After "temperature" please insert --of from 60 to 120°C and developing the film with an aqueous-alkaline solvent.--.

Signed and Sealed this

Thirteenth Day of April, 1993

Attest:

STEPHEN G. KUNIN

Attesting Officer     Acting Commissioner of Patents and Trademarks